(12) United States Patent
Uejima

(10) Patent No.: US 7,852,220 B2
(45) Date of Patent: Dec. 14, 2010

(54) COMPOSITE HIGH-FREQUENCY COMPONENT

(75) Inventor: Takanori Uejima, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 221 days.

(21) Appl. No.: 12/264,276

(22) Filed: Nov. 4, 2008

(65) Prior Publication Data
US 2009/0052358 A1  Feb. 26, 2009

Related U.S. Application Data

(63) Continuation of application No. PCT/JP2008/057336, filed on Apr. 15, 2008.

(30) Foreign Application Priority Data
May 10, 2007 (JP) .............................. 2007-125169

(51) Int. Cl.
  *G08B 13/14* (2006.01)
(52) U.S. Cl. ................................. 340/572.1
(58) Field of Classification Search ................ 340/500, 340/540, 568.1, 572.1
  See application file for complete search history.

(56) References Cited

U.S. PATENT DOCUMENTS

| 5,365,394 | A | * | 11/1994 | Gomez Ibarguengoitia .. 361/33 |
| 5,947,093 | A | * | 9/1999 | Ward ........................... 123/598 |
| 7,466,211 | B2 | * | 12/2008 | Uejima et al. ................ 333/101 |
| 2002/0127973 | A1 | | 9/2002 | Furutani et al. |
| 2008/0258839 | A1 | * | 10/2008 | Uejima et al. ................ 333/101 |
| 2008/0310382 | A1 | * | 12/2008 | Nakagawa et al. ........... 370/339 |

FOREIGN PATENT DOCUMENTS

JP  62-68324 U  4/1987
WO  2007/114114 A1  10/2007

OTHER PUBLICATIONS

Official Communication issued in International Patent Application No. PCT/JP2008/057336, mailed on May 27, 2008.

* cited by examiner

*Primary Examiner*—Chi H Pham
*Assistant Examiner*—Fan Ng
(74) *Attorney, Agent, or Firm*—Keating & Bennett, LLP

(57) ABSTRACT

A composite high-frequency component includes a transmission/reception selection switch. The transmission/reception selection switch includes a first diode disposed in series with a transmission signal line, a second diode disposed in shunt with a reception signal line. A first current route in which a direct current flows through the first diode and a second current route in which a direct current flows through the second diode are connected in parallel with each other. When a predetermined positive voltage is applied to a control terminal, a direct current flows through, in sequence, the control terminal, a resistor, an inductor, the diode, a strip line, a strip line, and a shared inductor, and a direct current also flows through, in sequence, the control terminal, the resistor), the diode, a strip line, the strip line, the strip line, and the shared inductor.

8 Claims, 8 Drawing Sheets

COMPOSITE HIGH-FREQUENCY COMPONENT

BACKGROUND OF THE INVENTION

1. Field of the Invention

The present invention relates to a composite high-frequency component that includes a high-frequency switch, and, in particular, to a composite high-frequency component that switches between transmission/reception signals with a low control voltage.

2. Description of the Related Art

A known composite high-frequency component transmits/receives transmission/reception signals of a plurality of communication systems in different frequency bands through an antenna and includes a high-frequency switch switching the transmission/reception signals to a transmission signal and a reception signal (see, for example, Japanese Unexamined Patent Application Publication No. 2000-165274).

The high-frequency switch includes a plurality of diodes to output a transmission signal to the antenna and to input a reception signal from the antenna into a reception portion.

The configuration of a composite high-frequency component shown in Japanese Unexamined Patent Application Publication No. 2000-165274 is described below and shown in FIG. 1.

This composite high-frequency component supports GSM1800 (DCS) in the 1800 MHz range, GSM1900 (PCS) in the 1900 MHz range, GSM850 in the 850 MHz range, and GSM900 (EGSM) in the 900 MHz range.

In FIG. 1, a diplexer (multiplexer/demultiplexer) 102 multiplexes or demultiplexes a transmission/reception signal of the GSM850/GSM900 system and a transmission/reception signal of the GSM1800/GSM1900 system. A transmission/reception selection switch 103 switches between a transmission signal and a reception signal of the GSM850/GSM900 system. Similarly, a transmission/reception selection switch 104 switches between a transmission signal and a reception signal of the GSM1800/GSM1900 system. A filter 105 allows the fundamental of a transmission signal of the GSM850/GSM900 system to pass therethrough and attenuates the harmonic. Similarly, a filter 106 allows the fundamental of a transmission signal of the GSM1800/GSM1900 system to pass therethrough and attenuates the harmonic.

In the transmission/reception selection switch 103, a diode GD1 and an inductor GSL1 are disposed in a transmission line though which a transmission signal of the GSM850/900 system is transmitted, and the diode GD1 is disposed in series with the transmission line for the transmission signal. A strip line GSL2, a diode GD2, and a capacitor GC5 are disposed in a transmission line through which a reception signal of the GSM850/900 system is transmitted, and the diode GD2 is disposed in shunt with the transmission line for the reception signal. The two diodes GD1 and GD2 are connected in series such that, when a positive voltage is applied from a terminal VcG for a transmission/reception selection control signal, a direct current passes through the diodes GD1 and GD2.

Similarly, in the transmission/reception selection switch 104, a diode DD1 and an inductor DPSL1 are disposed in a transmission line through which a transmission signal of the GSM1800/1900 system is transmitted, and the diode DD1 is disposed in series with the transmission line for the transmission signal. A strip line DSL2, a diode DD2, and a capacitor DC5 are disposed in a transmission line through which a reception signal of the GSM1800/1900 system is transmitted, and the diode DD2 is disposed in shunt with the transmission line for the reception signal. The two diodes DD1 and DD2 are connected in series such that, when a positive voltage is applied from a terminal VcD for a transmission/reception selection control signal, a direct current passes through the diodes DD1 and DD2.

The above-described composite high-frequency component is used in a communication device in a mobile communication system, such as a mobile telephone terminal, and the driving voltage therefor has been continuously reduced with a recent demand for power saving. However, when a voltage of a control signal in a known transmission/reception selection switch (high-frequency switch) illustrated in FIG. 1 is reduced, a voltage applied between the anode and cathode of each of the two diodes (for example, the diodes GD1 and GD2 in the transmission/reception selection switch 103 for the GSM850/900 system illustrated in FIG. 1) approaches the PN junction potential of the diode. Under this condition, the diode is incompletely conducting, so a phenomenon occurs in which ON resistance increases or a voltage between both ends of the diode varies in accordance with a voltage of a transmission signal to be transmitted/cut off. As a result, a problem arises in which an insertion loss (IL) and harmonic distortion increase. Consequently, there is a limit to the amount that the control voltage can be reduced.

SUMMARY OF THE INVENTION

To overcome the problems described above, preferred embodiments of the present invention provide a composite high-frequency component that switches a signal route using a control voltage that is less than the control voltage in a known high-frequency switch, that suppresses degradation in the insertion-loss characteristics and the harmonic-distortion characteristics, and that has a reduced number of parts.

A composite high-frequency component according to a preferred embodiment of the present invention includes a multiplexer/demultiplexer that includes two input/output portions to input or output transmission/reception signals of at least two communication systems in different frequency bands and an antenna connection portion and that multiplexes/demultiplexes the transmission/reception signals of the plurality of communication systems, and first and second high-frequency switches that switch between a transmission signal and a reception signal, the first and second high-frequency switches being connected between respective input/output portions for the plurality of communication systems and the two input/output portions of the multiplexer/demultiplexer. The multiplexer/demultiplexer is arranged to allow a direct current to pass between the two input/output portions thereof. Each of the first and second high-frequency switches has a first signal line between a shared signal input/output portion and a first signal input/output portion and has a second signal line between the shared signal input/output portion and a second signal input/output portion, and includes a first current route through which a direct current flows and a second current route through which a direct current flows, the first current route including a first diode, the second current route including a second diode. The first diode is disposed in series with the first signal line and the second diode is disposed in shunt with the second signal line. The first and second current routes are connected in parallel such that directions in which the direct currents flow therein are substantially the same. One node of the parallel connection is a control voltage input portion. The composite high-frequency component includes a shared inductor in which the direct currents having passed through the first and second current routes pass in common, the shared inductor being disposed between another node of the parallel connection and a ground. The shared inductor is shared by the first and second high-frequency switches.

The multiplexer/demultiplexer may preferably include a high-pass filter in which the shared inductor is connected in shunt with the signal lines for transmission/reception signals and a capacitor is connected in series therewith.

The shared inductor may preferably be disposed adjacent to one of the input/output portions of the multiplexer/demultiplexer, i.e., adjacent to a shared input input/output portion of one of the high-frequency switches.

The shared inductor may preferably be disposed adjacent to the antenna connection portion of the multiplexer/demultiplexer.

The shared inductor may preferably be connected in parallel with a capacitor, and the capacitor and the shared inductor may be arranged to resonate in parallel at a frequency in a pass band of the high-pass filter.

The shared inductor may preferably be arranged in the first or second signal line of the first or second high-frequency switch.

The first or second signal input/output portion of the first or second high-frequency switch may preferably be connected to a shared signal input/output portion of another high-frequency switch, such that the composite high-frequency component may preferably include a total of three or more high-frequency switches.

Circuitry of the composite high-frequency component may be provided in a single multilayer ceramic substrate.

According to preferred embodiments of the present invention, the following advantages are achieved.

The first and second current routes are connected in parallel such that their respective directions in which the direct currents flow are substantially the same, the inductor is disposed between one node of the parallel connection and the ground, and the control voltage is input into another node of the parallel connection. Therefore, the control voltage is applied to each of the first and second diodes, and the control voltage used in on-and-off control can be relatively low. That is, compared to when a control voltage is applied to two diodes connected in series, as in the related art, the voltage applied to each of the diodes is increased. As a result, the control voltage can be reduced without increasing the insertion loss and degrading the harmonic distortion.

Because only one inductor is provided as a shared inductor in which direct currents commonly flow through the first and second current routes, the number of parts can be reduced, and miniaturization can be advanced.

The inductor of the high-pass filter of the multiplexer/demultiplexer is used as the shared inductor, and thus, the shared inductor also functions as a component of the high-pass filter. Therefore, the number of parts can be reduced, and miniaturization can be further advanced. Because the attenuation characteristics of the high-pass filter can be improved and the direct current and low-frequency signals can be attenuated, the electrostatic discharge (ESD) characteristics can be improved.

The shared inductor provided adjacent to one of the input/output portions of the multiplexer/demultiplexer avoids an increase in the loss in lower range signals propagating in a lower range side of the multiplexer/demultiplexer.

Because the shared inductor provided adjacent to the antenna connection portion of the multiplexer/demultiplexer attenuates low-frequency signals propagating into a lower range side of the multiplexer/demultiplexer, the ESD characteristics are improved.

Connecting the shared inductor in parallel with the capacitor and causing them to resonate in parallel in the pass band of the high-pass filter improves the loss in higher range signals.

Arranging the shared inductor in the first or second signal line of the first or second high-frequency switch produces favorable loss characteristics of another signal line in which the shared inductor is not provided.

Connecting the first or second signal input/output portion of the first or second high-frequency switch to the shared signal input/output portion of another high-frequency switch, and thus, including a total of three or more high-frequency switches enables the composite high-frequency component to be used in a tri-band or further multi-band communication system.

Providing the circuitry of the composite high-frequency component in the signal multilayer ceramic substrate enables the composite high-frequency component to be constructed in one chip, such that the loss caused by wiring between parts can be reduced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

A composite high-frequency component according to a first preferred embodiment of the present invention will be described with reference to FIG. 2.

Figure 1:
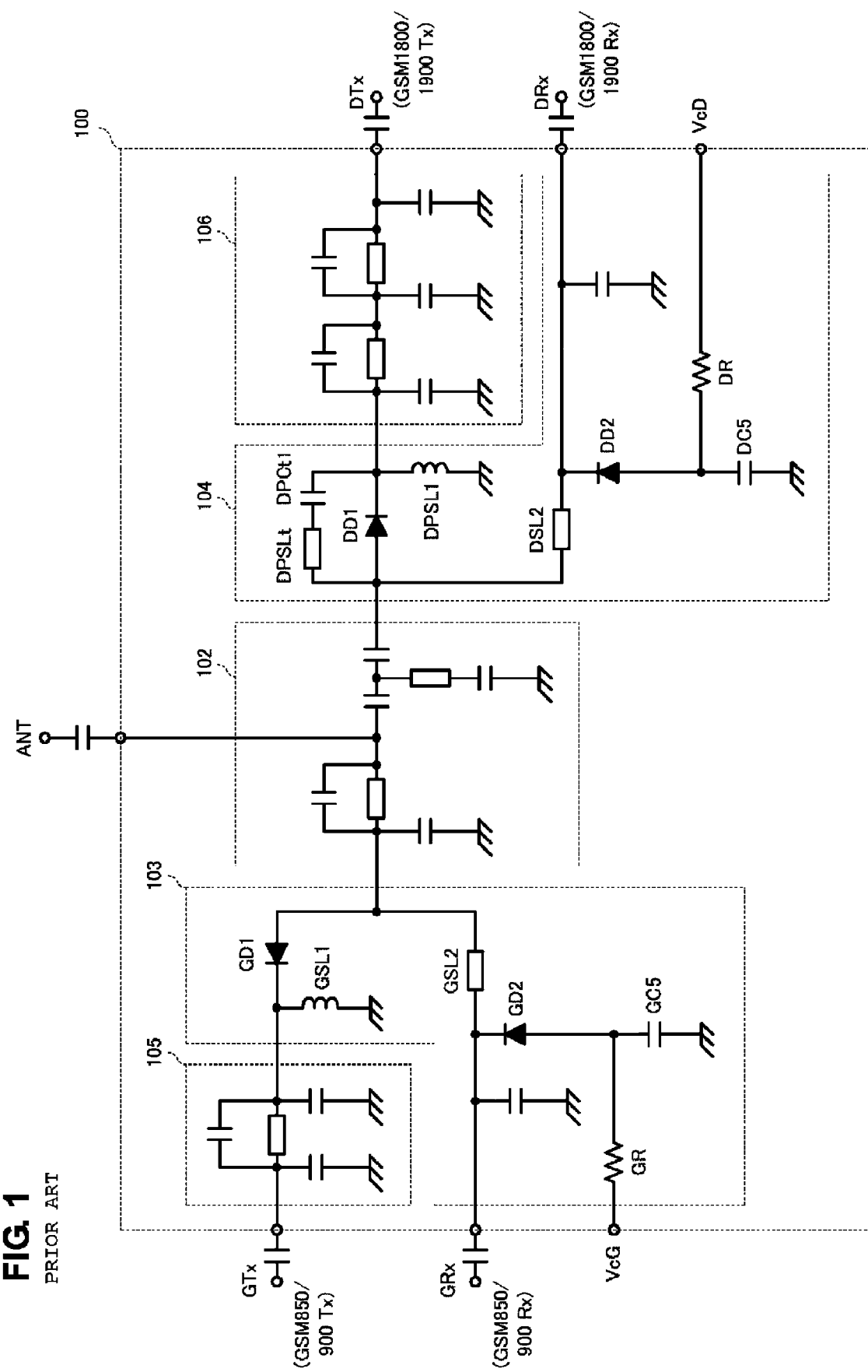
FIG. 1 is an illustration that shows a configuration of a known composite high-frequency component.
Figure 2:
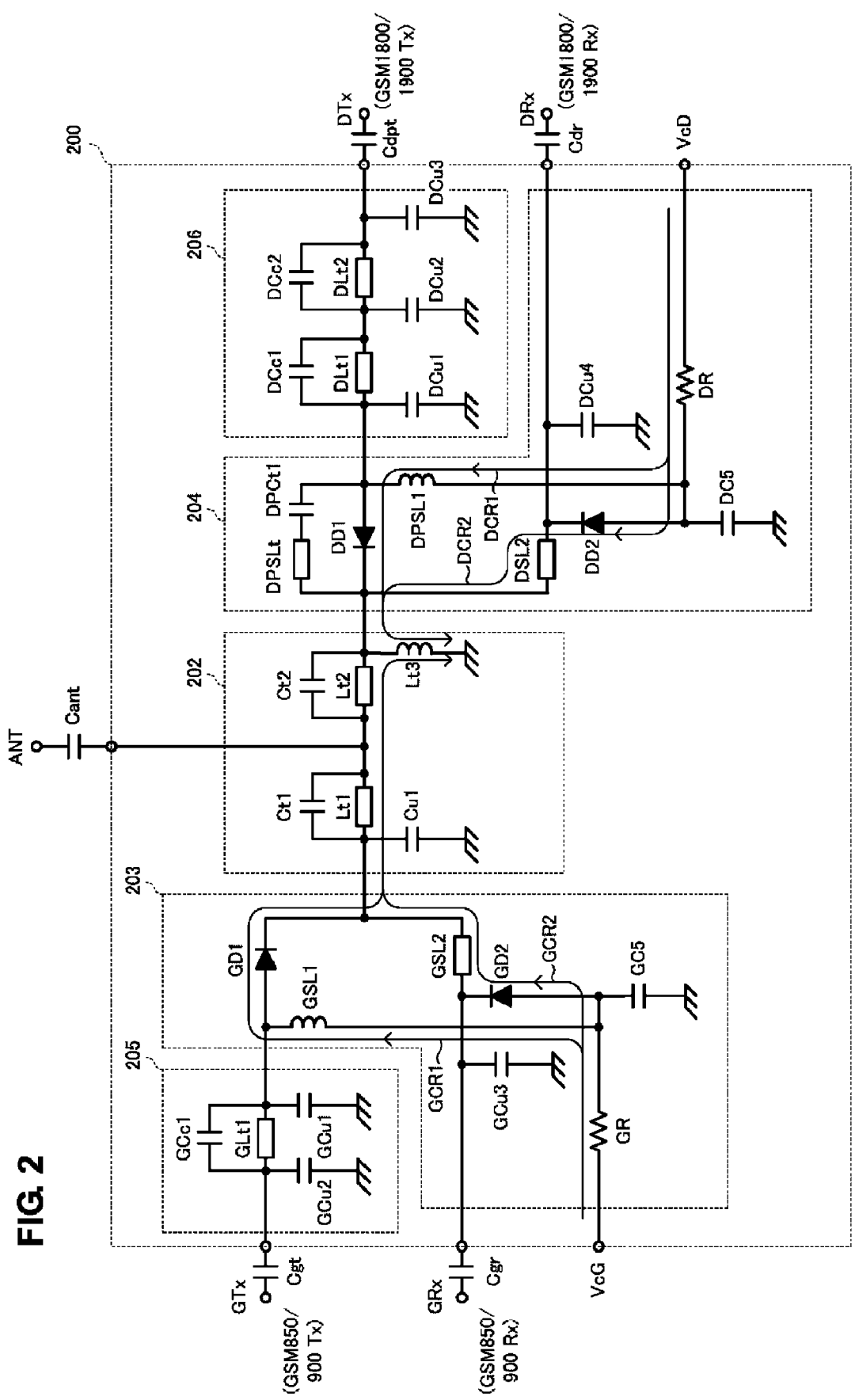
FIG. 2 is a circuit diagram of a composite high-frequency component according to a first preferred embodiment of the present invention.

A composite high-frequency component 200 illustrated in FIG. 2 supports GSM1800 (DCS) in the 1800 MHz range, GSM1900 (PCS) in the 1900 MHz range, GSM850 in the 850 MHz range, and GSM900 (EGSM) in the 900 MHz range.

In FIG. 2, a diplexer 202, i.e., a multiplexer/demultiplexer, multiplexes or demultiplexes a transmission/reception signal of the GSM850/GSM900 system and a transmission/reception signal of the GSM1800/GSM1900 system. A transmission/reception selection switch 203 switches between a transmission signal and a reception signal of the GSM850/GSM900 system. Similarly, a transmission/reception selection switch 204 switches between a transmission signal and a reception signal of the GSM1800/GSM1900 system. The diplexer 202 includes an antenna connection portion connected to an antenna terminal ANT and is arranged to allow a direct current to pass between its two input/output portions.

A filter 205 allows a transmission signal of the GSM850/GSM900 system to pass therethrough and attenuates the harmonic. Similarly, a filter 206 allows a transmission signal of the GSM1800/GSM1900 system to pass therethrough and attenuates the harmonic.

In the diplexer 202, capacitors Ct1 and Cu1 and a strip line Lt1 define a low-pass filter to allow a signal of the GSM850/900 system to pass therethrough, and a capacitor Ct2, an inductor Lt3, and a strip line Lt2 define a high-pass filter to allow a signal of the GSM1800/1900 system to pass therethrough. The inductor Lt3 defines a shared inductor.

In the filter 205, capacitors GCc1, GCu1, and GCu2 and a strip line GLt1 define a low-pass filter to allow a transmission signal of the GSM850/900 system to pass therethrough.

In the filter 206, capacitors DCc1, DCc2, DCu1, DCu2, and DCu3 and strip lines DLt1 and DLt2 define a low-pass filter to allow a transmission signal of the GSM1800/1900 system to pass therethrough.

In the transmission/reception selection switch 203 for the GSM850/900 system, a first diode GD1 is disposed in series with a transmission signal line for the GSM850/900 system to define a first signal line, and a second diode GD2 and a capacitor GC5 are disposed in shunt with a reception signal line for the GSM850/900 system to define a second signal line. A first current route GCR1 through which a direct current flows is defined as the path passing through, in sequence, a control terminal VcG, a resistor GR, an inductor GSL1, the first diode GD1, the strip line Lt1, the strip line Lt2, and the inductor Lt3. A second current route GCR2 through which a direct current flows is defined as the path passing through, in sequence, the control terminal VcG, the resistor GR, the second diode GD2, a strip line GSL2, the strip line Lt1, the strip line Lt2, and the inductor Lt3. The first current route GCR1 including the first diode GD1 and the second current route GCR2 including the second diode GD2 are connected in parallel.

A capacitor GCu3 disposed in the reception signal line for the GSM850/900 system performs impedance matching of the reception signal line when the diode GD2 is in the off state.

The basic configuration of the transmission/reception selection switch 204 for the GSM1800/1900 system is substantially the same as that of the transmission/reception selection switch 203 for the GSM850/900 system. A first diode DD1 is disposed in series with a transmission signal line for the GSM1800/1900 system (first signal line). A second diode DD2 is disposed in shunt with a reception signal line for the GSM1800/1900 system (second signal line).

A first current route DCR1 through which a direct current flows is defined as the path passing through, in sequence, a control terminal VcD, a resistor DR, an inductor DPSL1, the first diode DD1, and the inductor Lt3. A second current route DCR2 through which a direct current flows is defined as the path passing through, in sequence, the control terminal VcD, the resistor DR, the second diode DD2, a strip line DSL2, and the inductor Lt3. The first current route DCR1 including the first diode DD1 and the second current route DCR2 including the second diode DD2 are connected in parallel.

A series circuit including a strip line DPSLt and a capacitor DPCt1 is connected in parallel with the first diode DD1. The strip line DPSLt ensures isolation using parallel resonance of the capacitance of the diode DD1 and the strip line DPSLt when the diode DD1 is in the off state. The capacitor DPCt1 prevents a direct current from flowing without passing through the diode DD1.

A capacitor DCu4 performs impedance matching of the reception signal line when the diode DD2 is in the off state.

In this manner, both switching between transmission and reception for the GSM850/900 system and switching between transmission and reception for the GSM1800/1900 system can be controlled with a low voltage. Additionally, because the single shared inductor Lt3 is provided as an inductor through which a direct current having passed through each of the first and second current routes passes in common, the number of parts can be reduced and miniaturization can be advanced. Moreover, because the inductor Lt3 also functions as a component of the high-pass filter in the diplexer 202, the number of parts can be further reduced, so miniaturization can be further advanced.

Second Preferred Embodiment

Figure 3:
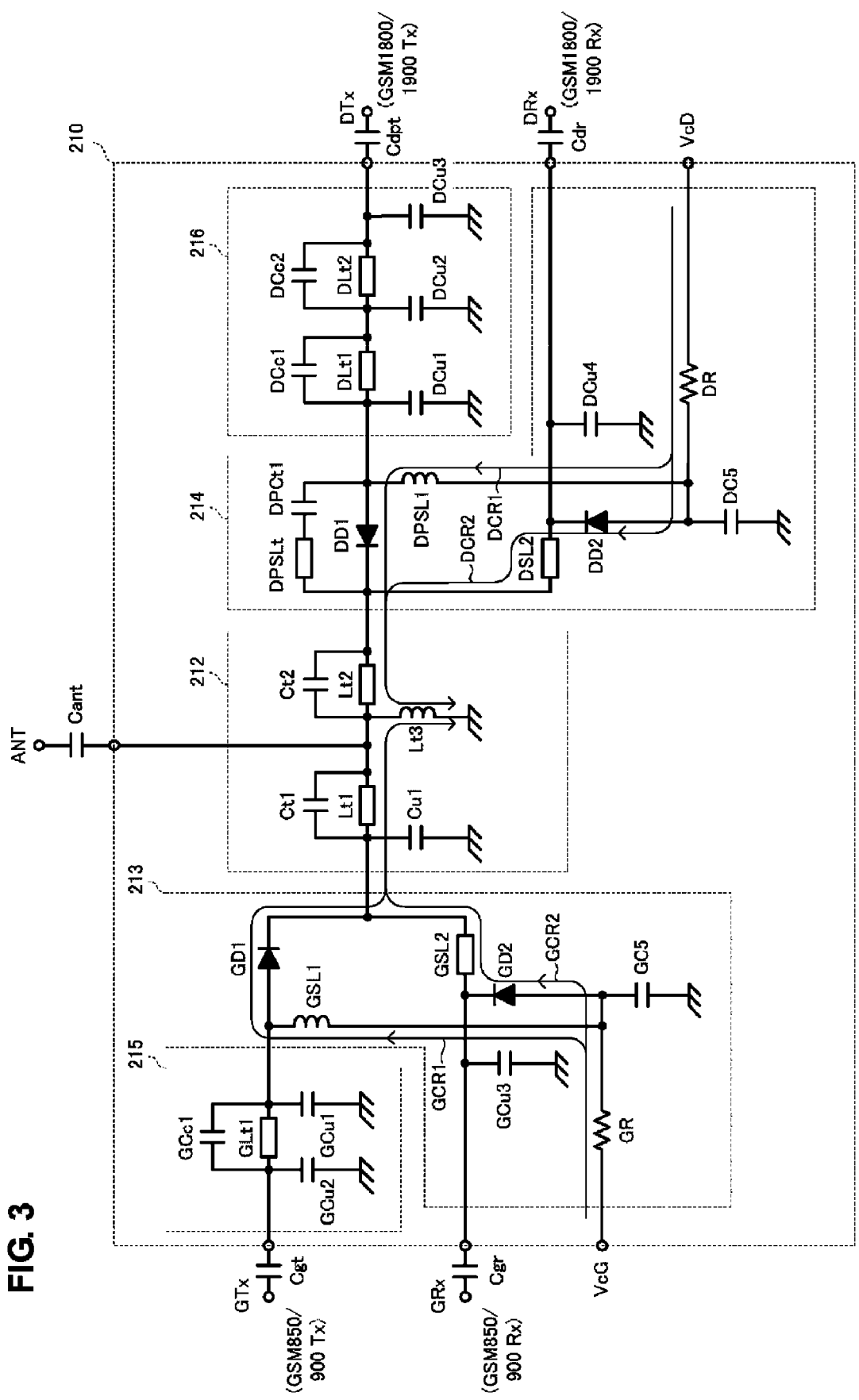
FIG. 3 is a circuit diagram of a composite high-frequency component according to a second preferred embodiment of the present invention.

A composite high-frequency component according to a second preferred embodiment of the present invention will be described with reference to FIG. 3.

The composite high-frequency component 210 differs from the composite high-frequency component illustrated in FIG. 2 in the connection location of the shared inductor Lt3. The shared inductor Lt3 shown in FIG. 2 is disposed adjacent to an input/output portion of the diplexer 202, whereas the shared inductor Lt3 shown in FIG. 3 is disposed adjacent to the antenna connection portion of a diplexer 212.

When a positive voltage is applied to a control terminal VcG, a direct current flows through, in sequence, the control terminal VcG, a resistor GR, an inductor GSL1, a diode GD1, a strip line Lt1, and the inductor Lt3 to define a first current route GCR1. A direct current also flows through, in sequence, the control terminal VcG, the resistor GR, a diode GD2, a strip line GSL2, the strip line Lt1, and the inductor Lt3 to define a second current route GCR2.

When a positive voltage is applied to a control terminal VcD, a direct current flows through, in sequence, the control terminal VcD, a resistor DR, an inductor DPSL1, a diode DD1, a strip line Lt2, and the inductor Lt3 to define a first current route DCR1. A direct current also flows through, in sequence, the control terminal VcD, the resistor DR, a diode DD2, a strip line DSL2, the strip line Lt2, and the inductor Lt3 to define a second current route DCR2.

In this manner, both switching between transmission and reception for the GSM850/900 system and switching between transmission and reception for the GSM1800/1900 system can be controlled with a low voltage.

Because the inductor Lt3 is disposed adjacent to the antenna connection portion of the diplexer 212, as described above, even if relatively low-frequency noise caused by, for example, static electricity, is applied from the antenna terminal, the noise is immediately shunted to the ground. Therefore, the low-frequency noise propagating in a lower range side of the diplexer (GSM850/900 system) is suppressed, and the ESD characteristics are improved.

Third Preferred Embodiment

Figure 4:
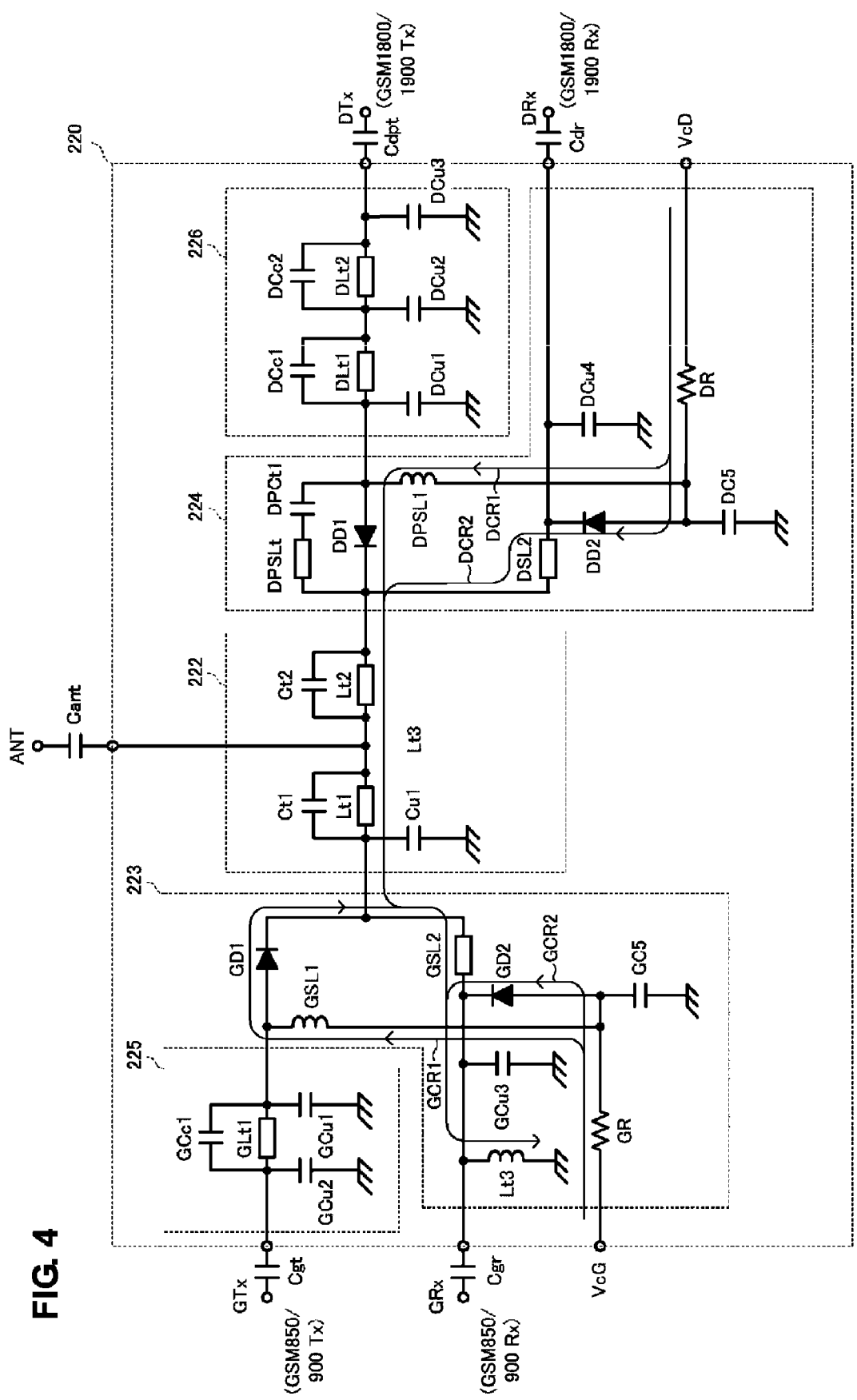
FIG. 4 is a circuit diagram of a composite high-frequency component according to a third preferred embodiment of the present invention.

A composite high-frequency component according to a third preferred embodiment of the present invention will be described with reference to FIG. 4.

The composite high-frequency component 220 differs from the composite high-frequency component illustrated in FIG. 2 in the connection location of the shared inductor Lt3. The shared inductor Lt3 shown in FIG. 2 is disposed in the diplexer 202, whereas the shared inductor Lt3 shown in FIG. 4 is disposed in shunt in a signal line for the GSM850/900 system, i.e., a reception signal line for the GSM850/900 system.

When a positive voltage is applied to a control terminal VcG, a direct current flows through, in sequence, the control terminal VcG, a resistor GR, an inductor GSL1, a diode GD1, a strip line GSL2, and the inductor Lt3 to define a first current route GCR1. A direct current also flows through, in sequence, the control terminal VcG, the resistor GR, a diode GD2, and the inductor Lt3 to define a second current route GCR2.

Because a direct current is allowed to pass between two input/output portions of a diplexer 222, when a positive voltage is applied to a control terminal VcD, a direct current flows through, in sequence, the control terminal VcD, a resistor DR, an inductor DPSL1, a diode DD1, a strip line Lt2, a strip line Lt1, a strip line GSL2, and the inductor Lt3 to define a first current route DCR1. A direct current also flows through, in sequence, the control terminal VcD, the resistor DR, a diode DD2, a strip line DSL2, the strip line Lt2, the strip line Lt1, the strip line GSL2, and the inductor Lt3 to define a second current route DCR2.

In this manner, both switching between transmission and reception for the GSM850/900 system and switching between transmission and reception for the GSM1800/1900 system can be controlled with a low voltage.

The shared inductor Lt3 provided in shunt in the signal line for the GSM850/900 system (reception signal line for the GSM850/900 system), as described above, produces improved loss characteristics of another signal line in which the shared inductor Lt3 is not provided, i.e., a transmission signal line for the GSM850/900 system.

Fourth Preferred Embodiment

Figure 5:
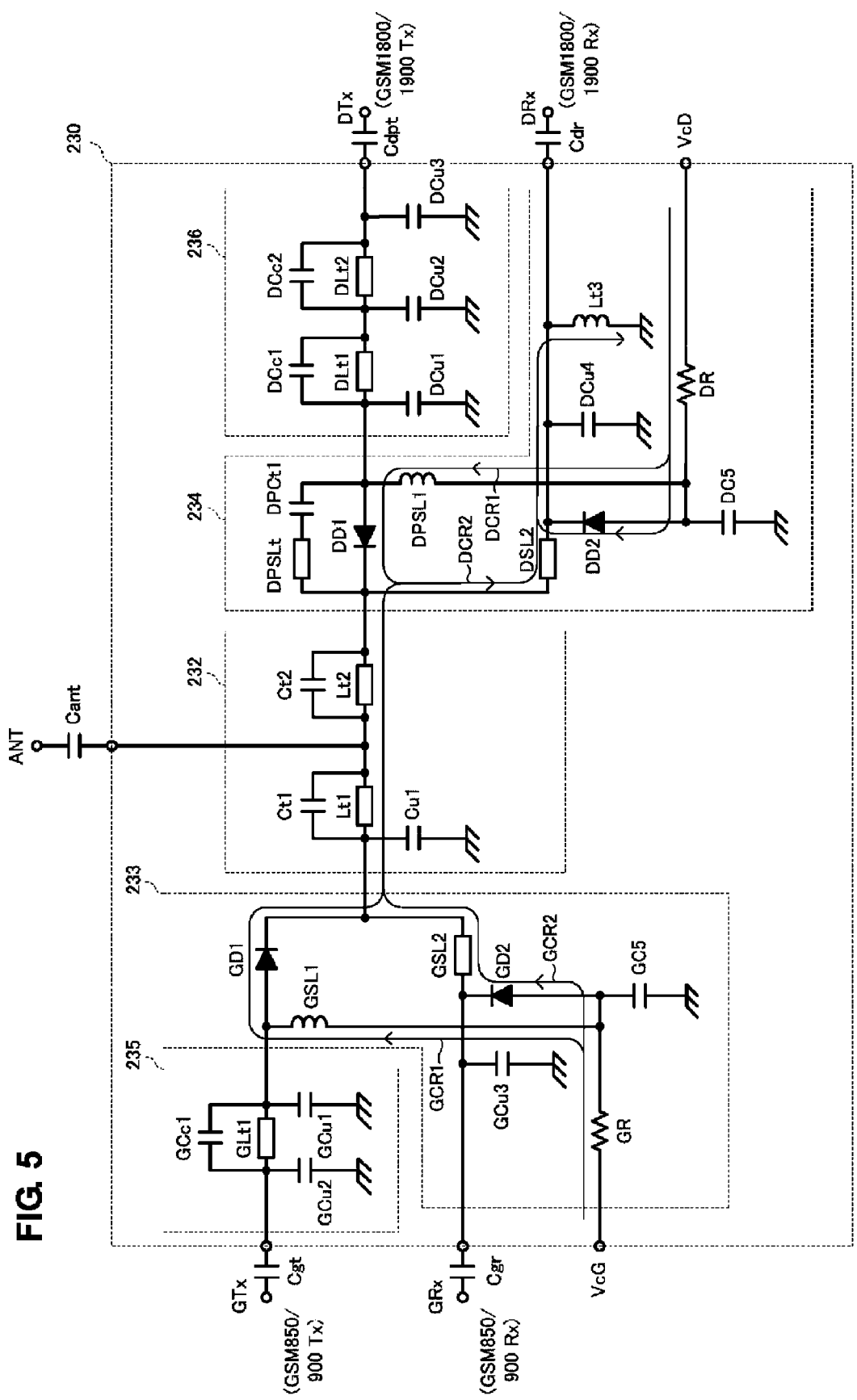
FIG. 5 is a circuit diagram of a composite high-frequency component according to a fourth preferred embodiment of the present invention.

A composite high-frequency component according to a fourth preferred embodiment of the present invention will be described with reference to FIG. 5.

The composite high-frequency component 230 differs from the composite high-frequency component illustrated in FIG. 2 in the connection location of the shared inductor Lt3. The shared inductor Lt3 shown in FIG. 2 is disposed in the diplexer 202, whereas the shared inductor Lt3 shown in FIG. 5 is disposed in shunt in a signal line for the GSM1800/1900 system, i.e., a reception signal line for the GSM1800/1900 system.

Because a direct current is allowed to pass between two input/output portions of a diplexer 232, when a positive voltage is applied to a control terminal VcG, a direct current flows through, in sequence, the control terminal VcG, a resistor GR, an inductor GSL1, a diode GD1, a strip line Lt1, a strip line Lt2, a strip line DSL2, and the inductor Lt3 to define a first current route GCR1. A direct current also flows through, in sequence, the control terminal VcG, the resistor GR, a diode GD2, a strip line GSL2, the strip line Lt1, the strip line Lt2, the strip line DSL2, and the inductor Lt3 to define a second current route GCR2.

When a positive voltage is applied to a control terminal VcD, a direct current flows through, in sequence, the control terminal VcD, a resistor DR, an inductor DPSL1, a diode DD1, the strip line DSL2, and the inductor Lt3 to define a first current route DCR1. A direct current also flows through, in sequence, the control terminal VcD, the resistor DR, a diode DD2, and the inductor Lt3 to define a second current route DCR2.

In this manner, both switching between transmission and reception for the GSM850/900 system and switching between transmission and reception for the GSM1800/1900 system can be controlled with a low voltage.

The shared inductor Lt3 provided in shunt in the signal line for the GSM1800/1900 system, i.e., a reception signal line for the GSM1800/1900 system, as described above, produces improved loss characteristics of another signal line in which the shared inductor Lt3 is not disposed, i.e., a transmission signal line for the GSM1800/1900 system.

Fifth Preferred Embodiment

A composite high-frequency component according to a fifth preferred embodiment of the present invention will be described with reference to FIG. 6.

The composite high-frequency component 240 differs from the composite high-frequency component illustrated in FIG. 2 in that a capacitor Cu2 is connected in parallel with the shared inductor Lt3 so that the capacitor Cu2 and the inductor Lt3 define a parallel resonant circuit. The resonant frequency of the parallel resonant circuit is set at a frequency in a pass band of a high-pass filter defined by a capacitor Ct2, a strip line Lt2, the inductor Lt3, and the capacitor Cu2. The remaining configuration is substantially the same as that illustrated in FIG. 2.

As described above, connecting the shared inductor Lt3 in parallel with the capacitor Cu2 and causing them to resonate in parallel in the pass band of the high-pass filter steepens attenuation characteristics from the pass band to the stop band of the high-pass filter, such that the loss in a diplexer at higher range signals (GSM1800/1900 system) is improved.

Figure 6:
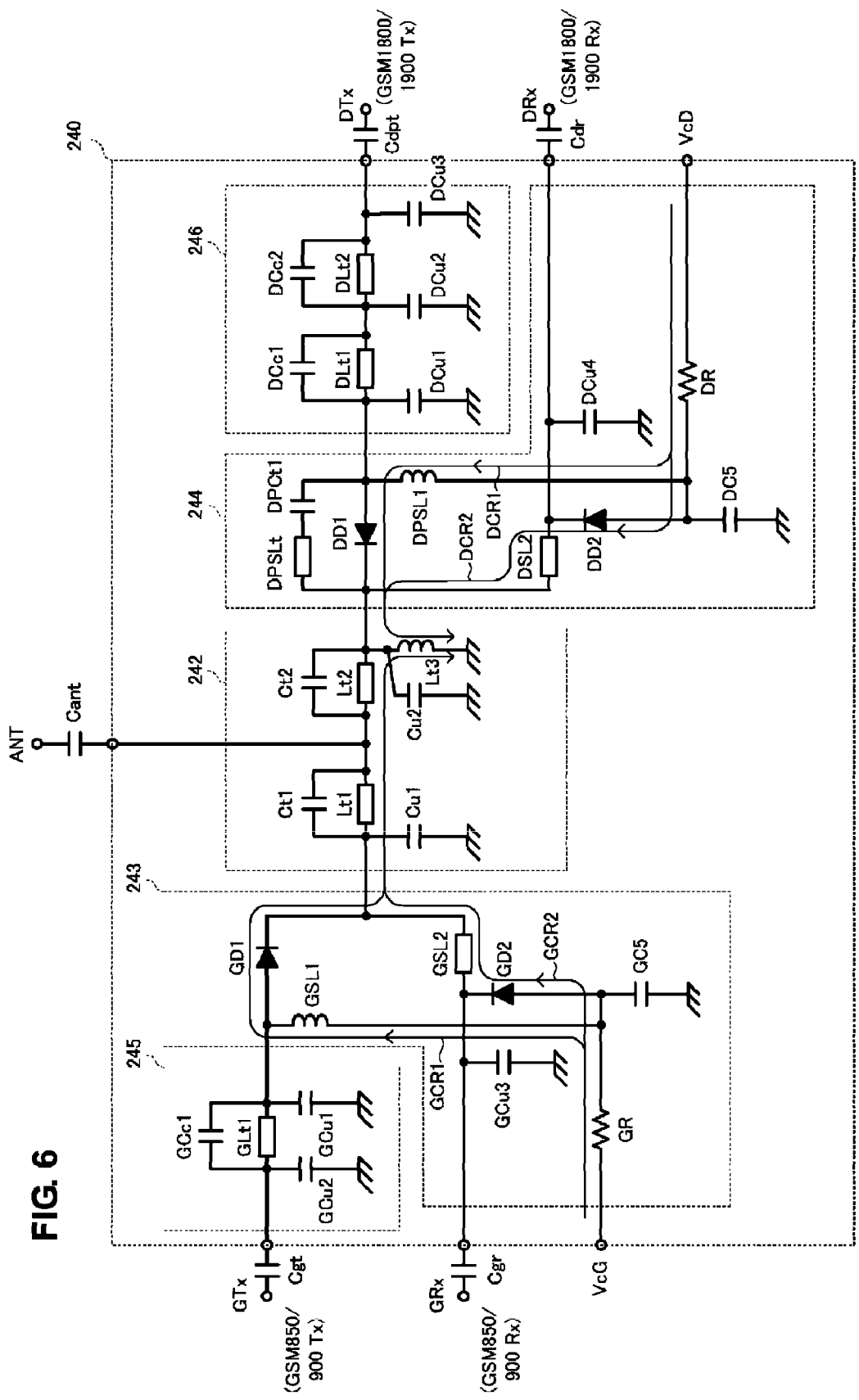
FIG. 6 is a circuit diagram of a composite high-frequency component according to a fifth preferred embodiment of the present invention.

In the example illustrated in FIG. 6, the shared inductor Lt3 is disposed adjacent to an input/output portion of the diplexer. However, as illustrated in FIG. 3, the shared inductor Lt3 may be disposed adjacent to the antenna connection portion, and the shared inductor Lt3 may be connected in parallel with the capacitor Cu2. In each of these arrangements, substantially the same advantages are achieved.

Sixth Preferred Embodiment

Figure 7:
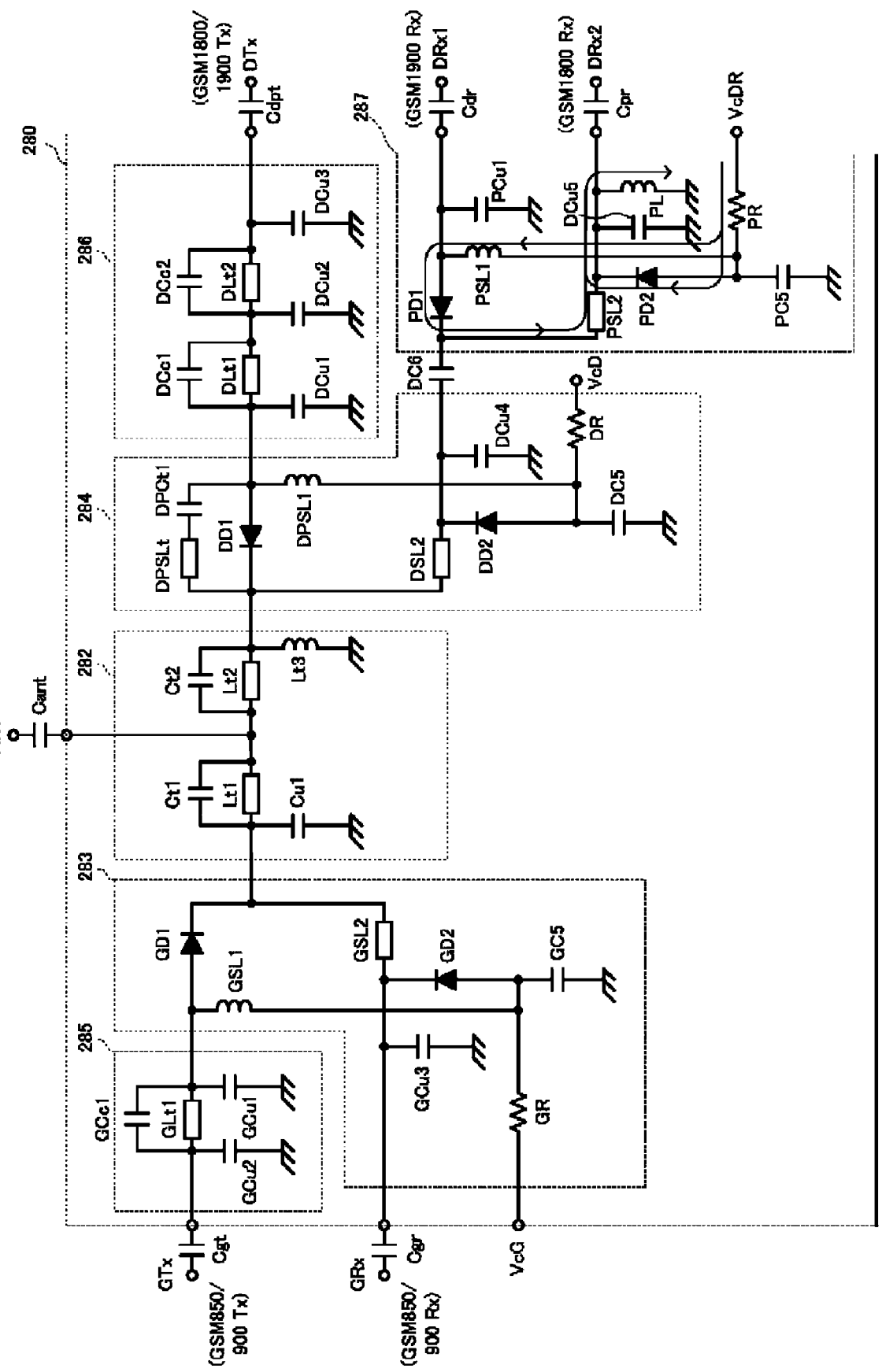
FIG. 7 is a circuit diagram of a composite high-frequency component according to a sixth preferred embodiment of the present invention.

A composite high-frequency component according to a sixth preferred embodiment of the present invention will be described with reference to FIG. 7.

In the first to fifth preferred embodiments, a dual-band switchplexer including a transmission-signal input terminal and a reception-signal output terminal for the GSM850/900 system and a transmission-signal input terminal and a reception-signal output terminal for the GSM1800/1900 system is illustrated. The composite high-frequency component 280 illustrated in FIG. 7 is used as a tri-band switchplexer in which separate reception-signal output terminals are used for the GSM1800 system and the GSM1900 system. A difference from the circuitry illustrated in FIG. 2 is that a reception-signal high-frequency switch 287 to switch a reception signal of the GSM1800/1900 system between a reception signal of the GSM1800 system and a reception signal for the GSM1900 system is included.

The reception-signal high-frequency switch 287 includes a first diode PD1 disposed in series with a reception signal line for the GSM1900 system and a second diode PD2 disposed in shunt with a reception signal line for the GSM1800 system. When a predetermined positive voltage is applied to a control terminal VcDR, the diodes PD1 and PD2 are both turned ON, and a direct current flows through, in sequence, the control terminal VCDR, a resistor PR, an inductor PSL1, the diode PD1, a strip line PSL2, and an inductor PL. A direct current also flows through, in sequence, the control terminal VcDR, the resistor PR, the diode PD2, and the inductor PL. In this manner, a reception signal of the GSM1800/1900 system output from a transmission/reception selection switch 284 is switched by the reception-signal high-frequency switch 287 between a reception signal of the GSM1900 system and a reception signal of the GSM1800 system with a low voltage.

A capacitor DC6 to block a direct current is disposed between the transmission/reception selection switch 284 and the reception-signal high-frequency switch 287. The remaining configuration and operation are substantially the same as those illustrated in FIG. 2.

Seventh Preferred Embodiment

Figure 8:
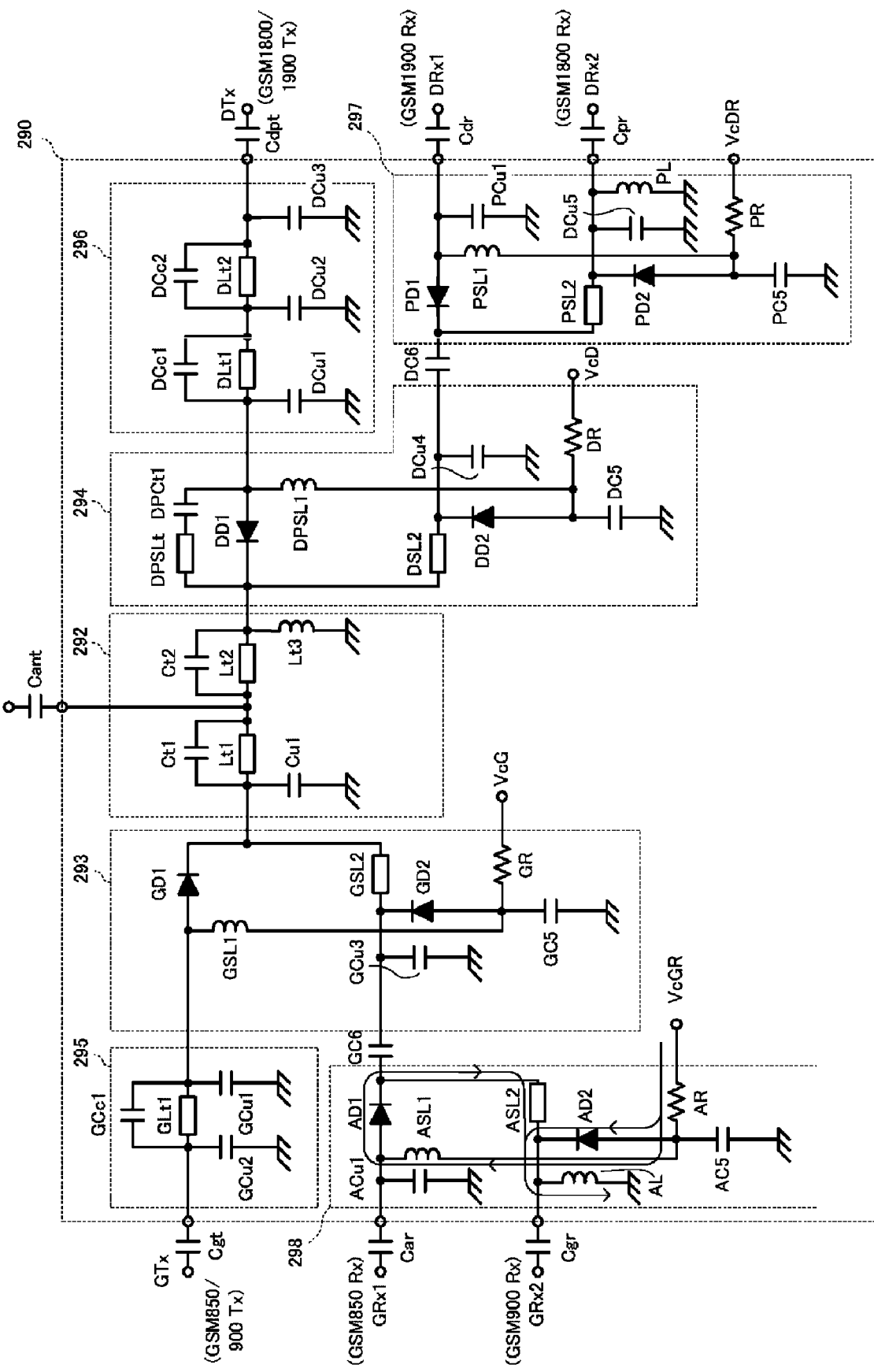
FIG. 8 is a circuit diagram of a composite high-frequency component according to a seventh preferred embodiment of the present invention.

A composite high-frequency component according to a seventh preferred embodiment of the present invention will be described with reference to FIG. 8.

In the sixth preferred embodiment, the composite high-frequency component is used as a tri-band switchplexer in which separate reception-signal output terminals are used for the GSM 1800 system and the GSM 1900 system. As shown in FIG. 8, a reception-signal high-frequency switch 298 to switch a reception signal of the GSM850/900 system between a reception signal of the GSM850 system and a reception signal for the GSM900 system is also included, such that the composite high-frequency component defines a quad-band switchplexer.

The reception-signal high-frequency switch 298 includes a first diode AD1 disposed in series with a reception signal line for the GSM850 system and a second diode AD2 disposed in shunt with a reception signal line for the GSM900 system. When a predetermined positive voltage is applied to a control terminal VcGR, the diodes AD1 and AD2 are both turned ON, and a direct current flows through, in sequence, the control terminal VcGR, a resistor AR, an inductor ASL1, the diode AD1, a strip line ASL2, and an inductor AL. A direct current also flows through, in sequence, the control terminal VcGR, the resistor AR, the diode AD2, and the inductor AL. In this manner, a reception signal of the GSM1800/1900 system output from a transmission/reception selection switch 293 is switched by the reception-signal high-frequency switch 298 between a reception signal of the GSM850 system and a reception signal of the GSM900 system with a low voltage.

A capacitor GC6 to block a direct current is disposed between the transmission/reception selection switch 293 and the reception-signal high-frequency switch 298. The remaining configuration and operation are substantially the same as those illustrated in FIGS. 2 and 7.

Eighth Preferred Embodiment

A composite high-frequency component according to an eighth preferred embodiment next will now be described.

FIGS. 2 to 8 illustrate only circuit diagrams of respective composite high-frequency components. These composite high-frequency components can be included in a multilayer ceramic substrate. Specifically, various electrode patterns defining capacitors, inductors, strip lines, and other elements are provided on a plurality of ceramic green sheets. These sheets are laminated to define a motherboard. After the motherboard is divided into individual components, they are integrally baked.

When a chip inductor, a chip capacitor, or another element that is not provided in a multilayer ceramic substrate is used, such an element is preferably mounted on the top surface of the multilayer ceramic substrate. For example, in FIGS. 2 to 8, components, such as capacitors, outside surrounded areas in the composite high-frequency components 200, 210, 220, 230, 240, 280, and 290 are provided by mounting individual chip inductors on the top surface of the multilayer ceramic substrate.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A composite high-frequency component comprising:
   a multiplexer/demultiplexer including at least two input/output portions arranged to input or output transmission/reception signals of at least two communication systems in different frequency bands and an antenna connection portion, the multiplexer/demultiplexer being arranged to multiplex/demultiplex the transmission/reception signals of the plurality of communication systems; and
   first and second high-frequency switches arranged to switch between a transmission signal and a reception signal, the first and second high-frequency switches being connected between input/output portions of the at least two communication systems and the at least two input/output portions of the multiplexer/demultiplexer; wherein
   the multiplexer/demultiplexer is arranged to allow a direct current to pass between the at least two input/output portions thereof;
   each of the first and second high-frequency switches includes a first signal line extending between a shared signal input/output portion and a first signal input/output portion and a second signal line extending between the shared signal input/output portion and a second signal input/output portion;
   each of the first and second high-frequency switches includes a first current route through which a direct current flows and a second current route through which a direct current flows;
   the first current route includes a first diode and the second current route including a second diode, wherein the first diode is disposed in series with the first signal line and the second diode is disposed in shunt with the second signal line;
   the first and second current routes are connected in parallel via a parallel connection such that directions in which the direct currents flow therein are substantially the same;
   one node of the parallel connection is a control voltage input portion;
   the composite high-frequency component includes a shared inductor in which the direct currents having passed through the first and second current routes pass in common, the shared inductor being disposed between another node of the parallel connection and a ground; and
   the shared inductor is shared by the first and second high-frequency switches.

2. The composite high-frequency component according to claim 1, wherein the multiplexer/demultiplexer includes a high-pass filter in which the shared inductor is connected in shunt with the signal lines for transmission/reception signals and a capacitor is connected in series therewith.

3. The composite high-frequency component according to claim 2, wherein the shared inductor is arranged adjacent to one of the at least two input/output portions of the multiplexer/demultiplexer.

4. The composite high-frequency component according to claim 2, wherein the shared inductor is disposed adjacent to the antenna connection portion of the multiplexer/demultiplexer.

5. The composite high-frequency component according to claim 3, wherein the shared inductor is connected in parallel with a capacitor, and the capacitor and the shared inductor are arranged to resonate in parallel at a frequency in a pass band of the high-pass filter.

6. The composite high-frequency component according to claim 2, wherein the shared inductor is arranged in one of the first and second signal lines of one of the first and second high-frequency switches.

7. The composite high-frequency component according to claim 1, wherein one of the first and second signal input/output portions of one of the first and second high-frequency switches is connected to a shared signal input/output portion of another high-frequency switch.

8. The composite high-frequency component according to claim 1, wherein all of the elements of the composite high-frequency component are provided in a single multilayer ceramic substrate.

* * * * *